United States Patent
Chi et al.

(10) Patent No.: US 8,492,888 B2
(45) Date of Patent: Jul. 23, 2013

(54) INTEGRATED CIRCUIT PACKAGING SYSTEM WITH STIFFENER AND METHOD OF MANUFACTURE THEREOF

(75) Inventors: HeeJo Chi, Ichon-si (KR); NamJu Cho, Uiwang-si (KR); HanGil Shin, Seongnam-si (KR)

(73) Assignee: STATS ChipPAC Ltd., Singapore (SG)

( * ) Notice: Subject to any disclaimer, the term of this patent is extended or adjusted under 35 U.S.C. 154(b) by 138 days.

(21) Appl. No.: 13/224,725

(22) Filed: Sep. 2, 2011

(65) Prior Publication Data

US 2013/0056863 A1    Mar. 7, 2013

(51) Int. Cl.
*H01L 23/04* (2006.01)
*H01L 21/58* (2006.01)

(52) U.S. Cl.
USPC ....................................... 257/704

(58) Field of Classification Search
USPC .. 257/678–733, 787–796, E23.011–E23.194, 257/100, 433, 434, 667, E23.117–E23.118, 257/E51.02, E23.11–E23.14, E21.502–E21.504, 257/527, 594, 618, 622; 438/15, 26, 51, 55, 438/106, 124–127, 25, 64–67, 122
See application file for complete search history.

(56) References Cited

U.S. PATENT DOCUMENTS

| | | | |
|---|---|---|---|
| 5,940,271 A | 8/1999 | Mertol | |
| 6,011,304 A | 1/2000 | Mertol | |
| 6,686,667 B2 * | 2/2004 | Chen et al. | 257/787 |
| 6,906,414 B2 | 6/2005 | Zhao et al. | |
| 6,989,296 B2 | 1/2006 | Huang et al. | |
| 7,196,427 B2 | 3/2007 | Mangrum | |
| 7,217,993 B2 | 5/2007 | Nishimura | |
| 7,432,586 B2 | 10/2008 | Zhao et al. | |
| 7,511,367 B2 * | 3/2009 | Minamio | 257/680 |
| 7,999,359 B2 | 8/2011 | Wu | |
| 2004/0150118 A1 * | 8/2004 | Honda | 257/778 |
| 2007/0145571 A1 * | 6/2007 | Lee et al. | 257/706 |
| 2009/0236731 A1 | 9/2009 | Shim et al. | |
| 2010/0244222 A1 | 9/2010 | Chi et al. | |
| 2010/0244223 A1 | 9/2010 | Cho et al. | |
| 2011/0037155 A1 | 2/2011 | Pagaila | |
| 2011/0147912 A1 | 6/2011 | Karpur et al. | |

* cited by examiner

*Primary Examiner* — Dao H Nguyen
*Assistant Examiner* — Tram H Nguyen
(74) *Attorney, Agent, or Firm* — Ishimaru & Associates LLP

(57) ABSTRACT

A method of manufacture of an integrated circuit packaging system includes: providing a substrate; mounting a stiffener, having a stiffener opening completely through the stiffener, on the substrate; molding an encapsulation on the substrate and directly on an outer upper periphery surface of the stiffener and exposing an inner upper periphery surface of the stiffener, the encapsulation exposing a portion of the substrate; mounting an integrated circuit over the substrate and within the perimeter of the stiffener; and attaching a lid plate on the inner upper periphery surface of the stiffener and over the integrated circuit, the lid plate extending above an encapsulation top side.

20 Claims, 5 Drawing Sheets

INTEGRATED CIRCUIT PACKAGING SYSTEM WITH STIFFENER AND METHOD OF MANUFACTURE THEREOF

TECHNICAL FIELD

The present invention relates generally to an integrated circuit packaging system, and more particularly to a system for an integrated circuit packaging system with a stiffener.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as smart phones, cellular phones, hands-free cellular phone headsets, personal digital assistants ("PDA's"), camcorders, notebook computers, entertainment devices, gaming devices, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Consumer electronics requirements demand more integrated circuits in an integrated circuit package while paradoxically providing less physical space in the system for the increased integrated circuits content. Continuous cost reduction is another requirement. Some technologies primarily focus on integrating more functions into each integrated circuit. Other technologies focus on stacking these integrated circuits into a single package. While these approaches provide more functions within an integrated circuit, they do not fully address the requirements for integration and cost reduction.

Thus, a need still remains for an integrated circuit packaging system providing integration, space savings, and low cost manufacturing. In view of the ever-increasing need to increase density of integrated circuits and particularly portable electronic products, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a substrate; mounting a stiffener, having a stiffener opening completely through the stiffener, on the substrate; molding an encapsulation on the substrate and directly on an outer upper periphery surface of the stiffener and exposing an inner upper periphery surface of the stiffener, the encapsulation exposing a portion of the substrate; mounting an integrated circuit over the substrate and within the perimeter of the stiffener; and attaching a lid plate on the inner upper periphery surface of the stiffener and over the integrated circuit, the lid plate extending above an encapsulation top side.

The present invention provides an integrated circuit packaging system, including: a substrate; a stiffener having a stiffener opening completely through the stiffener on the substrate; an encapsulation directly on the substrate and an outer upper periphery surface of the stiffener, exposing an inner upper periphery surface of the stiffener; an encapsulation inner sidewall over the outer upper periphery surface of the stiffener; an integrated circuit over the substrate and within the perimeter of the stiffener; and a lid plate on an inner upper periphery surface and over the integrated circuit.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
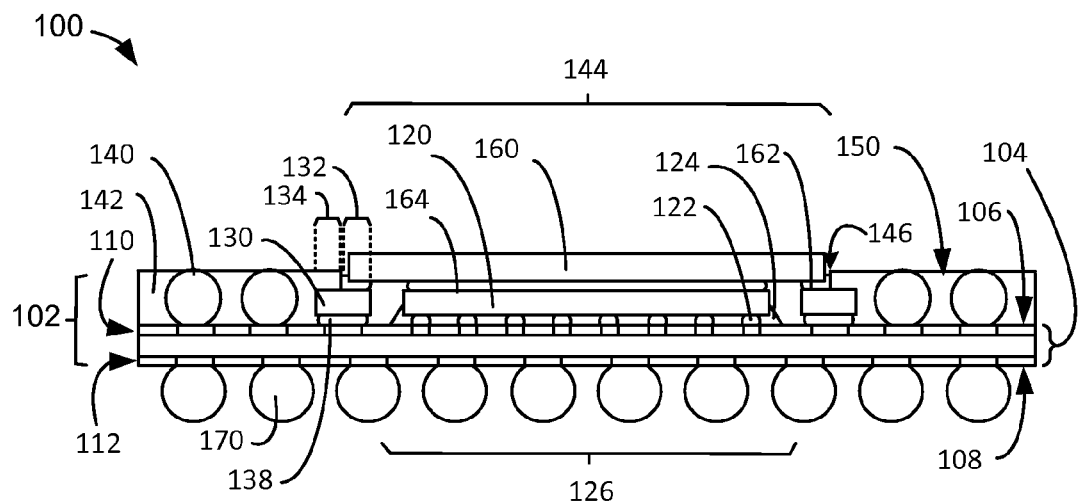
FIG. 1 is a cross-sectional view of an integrated circuit packaging system taken along line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGS. Similarly, although the views in the drawings for ease of description generally show similar orientations, this depiction in the FIGS. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane of an active surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is contact between elements. The term "directly on" means that there is direct contact between one element and another element without an intervening element. The term "processing" as used herein includes deposition of material or photoresist, patterning, exposure, development, etching, cleaning, and/or removal of the material or photoresist as required in forming a described structure.

The term "active side" refers to a side of a die or an electronic structure having active circuitry fabricated thereon or having elements for connection to the active circuitry within the die, the module, the package, or the electronic structure. The term "inactive side" refers to a side of a die or an electronic structure that does not have active circuitry or having elements for connection to the active circuitry within the die, the module, the package, or the electronic structure.

Figure 2:
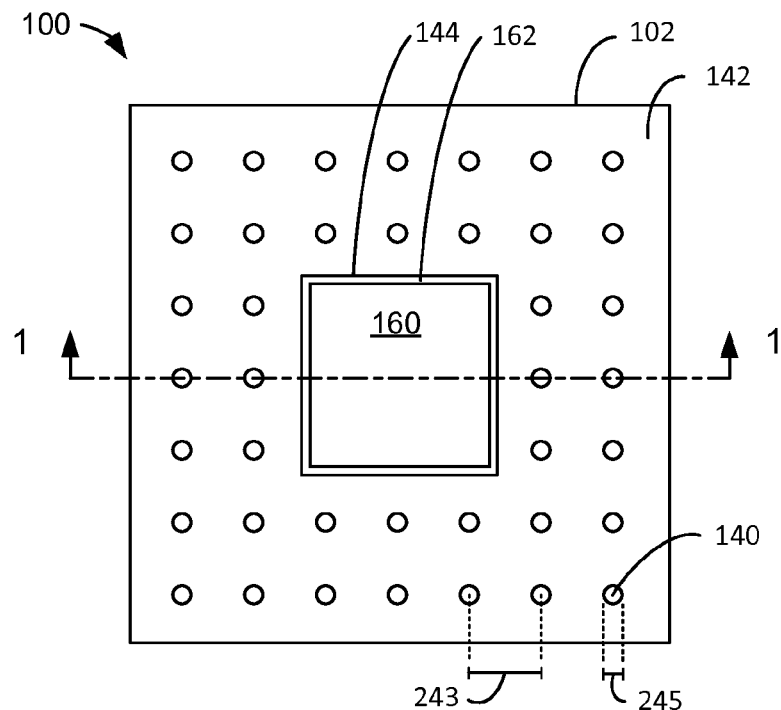
FIG. 2 is a top view of the integrated circuit packaging system.

Referring now to FIG. 1, therein is shown a cross-sectional view of an integrated circuit packaging system 100 taken along line 1-1 of FIG. 2 in a first embodiment of the present invention. The integrated circuit packaging system 100 can represent a pre-molded package-on-package-bottom (PoPb) with a stiffener 130.

The integrated circuit packaging system 100 can include a base package 102, which is defined as a semiconductor package. The integrated circuit packaging system 100 can include another package (not shown) that can be mounted over the base package 102.

The base package 102 can include a substrate 104. The substrate 104 is defined as a support structure for mounting and connecting an integrated circuit thereto including providing electrical connections through the support structure.

The substrate 104 can have a substrate component side 106 and a substrate system side 108 opposite the substrate component side 106. The substrate 104 can include a number of pads, vias, conductive layers, or a combination thereof to provide electrical connectivity between the substrate system side 108 and the substrate component side 106.

The substrate 104 can include a component redistribution layer 110 and a system redistribution layer 112. The component redistribution layer 110 is defined as an element for distributing electrical signals or potentials on the substrate component side 106. For example, the component redistribution layer 110 can include a laminated structure having electrical conductors for distributing electrical signals.

The system redistribution layer 112 is defined as an element for distributing electrical signals or potentials on the substrate system side 108. For example, the system redistribution layer 112 can include a laminated structure having electrical conductors for distributing electrical signals.

The component redistribution layer 110 is on the same side of the substrate 104 as the component redistribution layer 110. The system redistribution layer 112 is on the same side of the substrate 104 as the system redistribution layer 112. The substrate 104 can include electrical connections between the component redistribution layer 110 and the system redistribution layer 112 for transferring electrical signals to provide electrical connectivity between the component redistribution layer 110 and the system redistribution layer 112.

The base package 102 can include an integrated circuit 120, which is defined as a semiconductor device having a number of integrated circuits or transistors interconnected to form active circuits (not shown). The integrated circuit 120 can be mounted over the substrate 104. The integrated circuit 120 can include a flip chip die, a wire bond die, a complementary metal oxide semiconductor (CMOS) imaging sensor, a charge coupled device (CCD), or a combination thereof.

The integrated circuit 120 can be directly connected to the component redistribution layer 110 with internal interconnectors 122 attached to the integrated circuit 120 and the component redistribution layer 110 of the substrate 104. The internal interconnectors 122 are defined as electrically conductive connectors for connecting an integrated circuit to another system level or another integrated circuit. For example, the internal interconnectors 122 can be electrically connected to the conductors of the component redistribution layer 110.

The integrated circuit 120 can be attached to the component redistribution layer 110 with an underfill 124. The underfill 124 is defined as an adhesive material applied between an electrical component and a mounting surface. The underfill 124 can include a non-conducting epoxy, an electrically insulating adhesive, an encapsulant, a resin, or a combination thereof. The underfill 124 can surround the internal interconnectors 122 providing mechanical support and also function to protect the connection between the integrated circuit 120 and the substrate 104. The underfill 124 is optional.

The base package 102 can include the stiffener 130, which is defined as an element mounted over the substrate 104 for increasing the rigidity of the base package 102. The stiffener 130 can have a stiffener opening 126 completely through the stiffener 130.

For example, the stiffener 130 can be grounded forming an electromagnetic interference (EMI) shield. The stiffener 130 can be an electrically conductive element. The stiffener 130 can be formed from a metal, an alloy, a laminate, or a combination thereof.

In another example, the stiffener 130 can be used to dissipate heat from the integrated circuit 120 via the substrate 104.

The stiffener 130 can be formed from a metallic material, such as copper plated nickel, copper, nickel, an alloy, or a combination thereof. The stiffener 130 can be thermally coupled to the substrate 104 and the integrated circuit 120.

It is understood that the stiffener 130 can completely or partially surround the perimeter of the integrated circuit 120. The stiffener 130 can have different geometries including a rectangular geometry, a circular geometry, an oval geometry, including linear or arc shaped segments coupled to form a continuous geometry, or any combination thereof. The stiffener 130 may also be provided in a single body unit around the integrated circuit 120. For example, the stiffener 130 can be a continuous rectangular structure having the stiffener opening 126 completely through the structure forming a hollow rectangle with four side arms.

The stiffener 130 can surround the periphery of the integrated circuit 120 in a plane parallel to the horizontal plane. The periphery is defined as the outer limits or edge of an object being referenced. The integrated circuit 120 can be completely within the area defined by the periphery of the stiffener 130. The integrated circuit 120 can be positioned completely within the stiffener opening 126 of the stiffener 130.

The upper surface of the stiffener 130 is the surface facing away from the substrate 104. The stiffener 130 can have an inner upper periphery surface 132, which is defined as the portion of the upper surface of the stiffener 130 that is closest to the stiffener opening 126 of the stiffener 130. The stiffener 130 can have an outer upper periphery surface 134, which is defined as a portion of the upper surface of the stiffener 130 that furthest from the stiffener opening 126 of the stiffener 130. The inner upper periphery surface 132 can form a continuous non-vertical surface around the inner upper periphery surface 132 of the stiffener 130.

In another example, the stiffener 130 can also be an insulating element. The stiffener 130 can be formed from plastic, ceramic, resin, or a combination thereof.

The stiffener 130 can be attached to the component redistribution layer 110 with a stiffener adhesive 138. The stiffener adhesive 138 is defined as a material for bonding the stiffener 130 with a mounting surface, such as the component redistribution layer 110.

In an EMI shielding example, the stiffener adhesive 138 can be electrically conductive to form an electrical connection between the stiffener 130 and the component redistribution layer 110.

In a mechanical stiffening example, the stiffener adhesive 138 can include an insulating material such as a polymer resin, plastic, ceramic, or a combination thereof. The stiffener adhesive 138 can be directly on the component redistribution layer 110, including being directly on a conductor of the component redistribution layer 110.

The base package 102 can include a vertical interconnector 140, which is defined as an electrical conductor for forming an electrical and mechanical connection to the base package 102. The vertical interconnector 140 can include a solder ball, a solder post, a lead, a conductive structure, a conductive post, a Z-interconnect, or a combination thereof. The vertical interconnector 140 can be directly on the component redistribution layer 110, including being directly on a conductor of the component redistribution layer 110.

The base package 102 can include an encapsulation 142, which is defined as a package cover to hermetically seal an integrated circuit or other contents within the package cover for providing mechanical and environmental protection. The encapsulation 142 can be formed over the substrate 104 and a portion of the stiffener 130. The encapsulation 142 can be molded on the substrate 104 and completely outside the periphery of the integrated circuit 120. The encapsulation 142 can have an encapsulation opening 144 exposing the IC, a portion of the stiffener, and a portion of the substrate. The encapsulation also exposes the stiffener opening. In this example, the encapsulation completely exposes the stiffener opening.

The encapsulation 142 can be formed over a portion of the vertical interconnector 140. The encapsulation 142 can expose a top portion of the vertical interconnector 140.

The encapsulation 142 can be formed with an electrically insulating material. For example, the encapsulation 142 can include a plastic resin, an electrically insulating material, or a combination thereof.

The encapsulation 142 can be formed directly on the component redistribution layer 110. The encapsulation 142 can be formed directly on the vertical interconnector 140. The encapsulation 142 can include an encapsulation inner sidewall 146, which is defined as the non-horizontal side of the encapsulation 142 that faces the encapsulation opening 144.

The encapsulation inner sidewall 146 can be formed with a molding process. The encapsulation inner sidewall 146 can have the characteristics of being formed by a molding process, including having a smooth surface produced by a molding surface with no saw marks, abrasions from sawing or grinding, or burn marks from a laser process. For example, a mold can be used to form the encapsulation inner sidewall 146 and form a surface that is as smooth as the mold surface.

The encapsulation inner sidewall 146 can be formed over the stiffener 130. The encapsulation inner sidewall 146 can form a molded step of the encapsulation material over the outer upper periphery surface 134 of the stiffener 130 and exposing the inner upper periphery surface 132 of the stiffener 130. The encapsulation 142 can be formed directly on the outer upper periphery surface 134 of the stiffener 130 and exposing the inner upper periphery surface 132 of the stiffener 130.

In a specific example, the encapsulation 142 can be formed with an encapsulation material applied to the substrate 104 outside of the periphery of the stiffener 130. The stiffener 130 can act as a mold dam and prevent the encapsulation material from entering the stiffener opening 126. The mold dam is defined as an element to prohibit the flow of the encapsulation material.

The encapsulation 142 can include an encapsulation top side 150, which is defined as a top surface of the encapsulation 142 on the side facing away from the substrate 104. A plane of the encapsulation top side 150 can be coplanar with a plane of the top of the vertical interconnector 140.

The base package 102 can include a lid plate 160 over the stiffener 130. The lid plate 160 is defined as an element covering the stiffener opening 126 of the stiffener 130 and adjacent to the encapsulation inner sidewall 146.

For example, the lid plate 160 can form part of a thermal dissipation system. The lid plate 160 can be thermally coupled to the stiffener 130, the substrate 104 and the integrated circuit 120. Heat can flow from the integrated circuit 120 to the lid plate 160 to be dissipated by convection or radiation.

The lid plate 160 can function as a heat sink, a heat slug, a thermal radiator, a thermal transfer unit, or a combination thereof. The lid plate 160 can be formed from a thermally conductive material including a metal plate, a ceramic plate, a composite plate, or a combination thereof.

In another example, the lid plate 160 can form part of an electromagnetic interference (EMI) shield. The lid plate 160 can be electrically coupled to the stiffener 130 and the substrate 104. The lid plate 160 can be coupled to an electrical ground connection. The lid plate 160 can be formed from an electrically conductive material such as a metal, an alloy, or a combination thereof.

The lid plate 160 can be mounted on the inner upper periphery surface 132 of the stiffener 130 and adjacent to the encapsulation inner sidewall 146. The lid plate 160 is directly over the integrated circuit 120.

The lid plate 160 can be attached to the inner upper periphery surface 132 with a lid adhesive 162. The lid adhesive 162 is defined as a material for bonding the lid plate 160 to the inner upper periphery surface 132.

The lid adhesive 162 can be electrically conductive to form an electrical connection between the lid plate 160 and the stiffener 130. The lid adhesive 162 can include an insulating material such as a polymer resin, plastic, ceramic, or a combination thereof.

The lid plate 160 can be attached to the integrated circuit 120 with a chip adhesive 164. The chip adhesive 164 is defined as a material for bonding the lid plate 160 to the integrated circuit 120. The chip adhesive 164 can form a layer between the lid plate 160 and the integrated circuit 120. The chip adhesive 164 can include a thermal interface material, an epoxy, a resin, a thermal paste, an electrically conductive paste, a polymer, or a combination thereof.

The base package 102 can include external connectors 170. The external connectors 170 are defined as electrically conductive elements for connecting the base package 102 to another system level, such as an external system, another package, a printed circuit board, an interposer, or a combination thereof.

The external connectors 170 can be electrically connected to the conductors of the system redistribution layer 112 of the substrate 104. The external connectors 170 can include solder balls, solder posts, leads, a conductive post, electrical connectors, sockets, pins, or a combination thereof.

The external connectors 170 can form an electrical connection to the conductors of the system redistribution layer 112, the component redistribution layer 110, the integrated circuit 120, the internal interconnectors 122, or a combination thereof.

It has been discovered that the present invention provides improved reliability by using the stiffener 130 as the mold dam to guide the formation and positioning of the encapsulation 142. The encapsulation 142 can be formed and shaped by the stiffener 130 to prevent the encapsulation from covering the electrical connections of the integrated circuit 120 and causing blocked electrical connections. The use of the stiffener 130 as the mold dam can simplify manufacturing my reducing the need to use additional mold dams to form and position the encapsulation 142.

It has been discovered that the present invention provides improved reliability by providing the inner upper periphery surface 132 surrounded by the encapsulation inner sidewall 146 for securely mounting the lid plate 160. Securely mounting the lid plate 160 can prevent the accidental mechanical separation of the lid plate 160 from the base package 102. The inner upper periphery surface 132 and the encapsulation inner sidewall 146 on the outer upper periphery surface 134 of the stiffener 130 combine to form an opening that can be used to securely mount the lid plate 160 thus providing a better seal, improved package stability, and easier manufacturing.

It has been discovered that the present invention provides improved package stability by mounting the lid plate 160 on the stiffener 130 with the lid adhesive 162. Attaching the lid plate 160 to the stiffener 130 creates a box-like structure with enhanced stability. The combination of the lid plate 160 and the stiffener 130 can prevent flexure of the base package 102 and reduce the chance of damaging an electrical solder connection.

It has been discovered that the present invention provides improved electromagnetic shielding. Connecting the lid plate 160 to the stiffener 130 using the lid adhesive 162 and the stiffener adhesive 138 that are electrically conductive can form an electro-magnetic interference (EMI) shield around the integrated circuit 120. The lid plate 160 and the stiffener 130 can work together to reduce the amount of electrical interference transferred between the integrated circuit 120 and the exterior of the base package 102.

It has been discovered that the present invention provides improved thermal performance and cooling. By attaching the integrated circuit 120 to the lid plate 160 with the chip adhesive 164 allows increased transfer of heat from the integrated circuit 120 to the lid plate 160 and the stiffener 130. The chip adhesive 164 provides a large surface area for the transfer of heat from the integrated circuit 120 to the lid plate 160 where the heat can be dissipated by radiation or convection, thus acting as a heat sink or a heat slug.

It has been discovered that the present invention provides a protected environment of the integrated circuit 120 with the stiffener 130 attached to the substrate 104, further attached to the lid plate 160 with the lid adhesive 162 and the stiffener adhesive 138. The stiffener 130 and the lid plate 160 form a hermetically sealed space that can prevent contamination or damage to the integrated circuit 120, thus protecting the integrated circuit 120.

It has been discovered that the present invention provides enhanced package integrity by forming the encapsulation 142 directly on the stiffener 130. The encapsulation 142 can form a rectangular structure with an opening formed by the stiffener 130. The rigidity of the encapsulation 142 can supplement the structural stability provided by the stiffener 130 to increase the overall stability of the base package 102 thus reducing warpage of the base package.

It has been discovered that the present invention provides increased yield during manufacturing because the integrated circuit 120 provides improved reliability since it the integrated circuit 120 is a known good die (KGD). By only using known good die components, the amount of manufacturing defects is reduced.

Referring now to FIG. 2, therein is shown a top view of the integrated circuit packaging system 100. The top view depicts the base package 102 having the encapsulation 142, the lid plate 160, and the top of the vertical interconnector 140. The top view also depicts the line 1-1 across the integrated circuit packaging system 100.

The vertical interconnector 140 is defined as an electrical conductor for connecting with an external system (not shown) or another system level. The vertical interconnector 140 can have a vertical interconnector pitch 243, which is defined as the distance between the centers of two adjacent elements of the vertical interconnector 140. The vertical interconnector 140 can have a vertical interconnector diameter 245.

The encapsulation 142 can have the encapsulation opening 144 completely through the center of the encapsulation 142. The lid plate 160 can be mounted on the lid adhesive 162. The lid adhesive 162 can be over the inner upper periphery surface 132 of FIG. 1. The inner upper periphery surface 132 and the lid adhesive 162 can be around the interior of the encapsulation opening 144.

Figure 3:
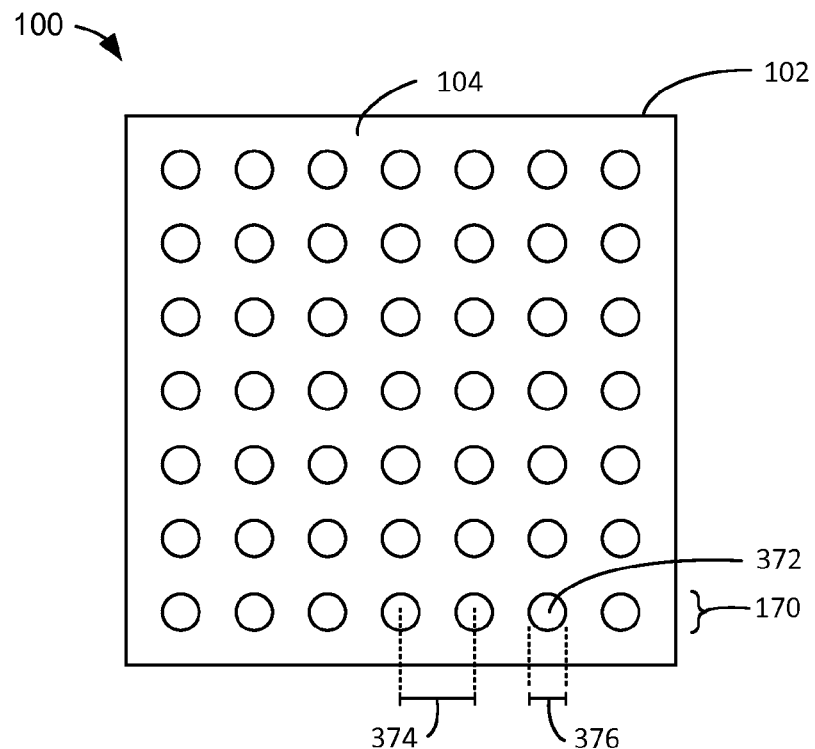
FIG. 3 is a bottom view of an integrated circuit packaging system.

Referring now to FIG. 3, therein is shown a bottom view of the integrated circuit packaging system 100. The bottom view depicts the base package 102 having the external connectors 170 on the substrate 104.

The external connectors 170 are defined as electrical conductors for connecting with an external system (not shown). The external connectors 170 can include an external interconnect 372. The external connectors 170 can have an external interconnect pitch 374 which is defined as the distance between the centers of two adjacent elements of the external connectors 170. The external interconnect 372 can have an external interconnect diameter 376.

Figure 4:
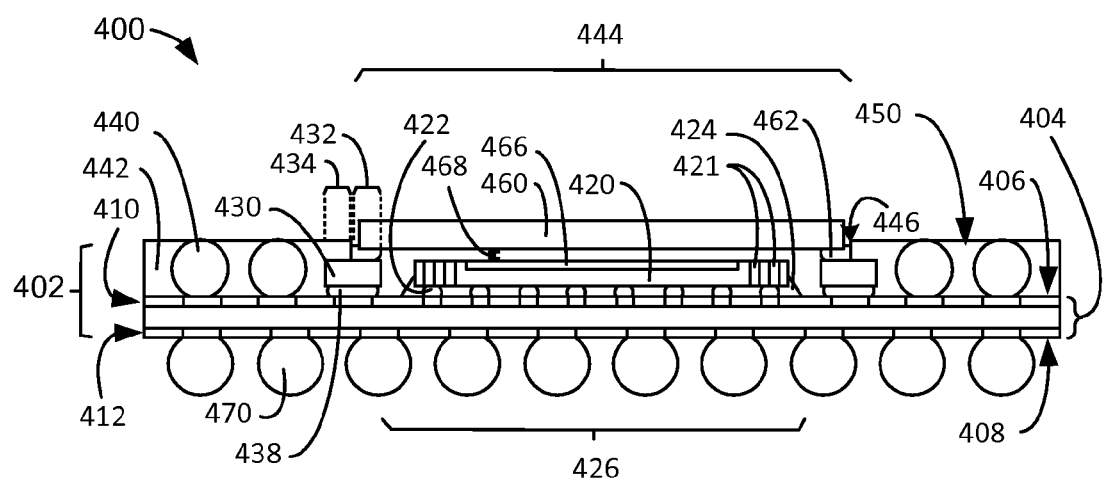
FIG. 4 is a cross-sectional view of an integrated circuit packaging system taken along a line 1-1 as exemplified by the top view of FIG. 2 in a second embodiment of the present invention.

Referring now to FIG. 4, therein is shown a cross-sectional view of an integrated circuit packaging system 400 taken along a line 1-1 as exemplified by the top view of FIG. 2 in a second embodiment of the present invention. The integrated circuit packaging system 400 can represent a pre-molded package-on-package-bottom (PoPb) with a stiffener 430.

The integrated circuit packaging system 400 can include a base package 402, which is defined as a semiconductor package. The integrated circuit packaging system 400 can include another package (not shown) that can be mounted over the base package 402.

The base package 402 can include a substrate 404. The substrate 404 is defined as a support structure for mounting and connecting an integrated circuit thereto including providing electrical connections through the support structure.

The substrate 404 can have a substrate component side 406 and a substrate system side 408 opposite the substrate component side 406. The substrate 404 can include a number of pads, vias, conductive layers, or a combination thereof to provide electrical connectivity between the substrate system side 408 and the substrate component side 406.

The substrate 404 can include a component redistribution layer 410 and a system redistribution layer 412. The component redistribution layer 410 is defined as an element for distributing electrical signals or potentials on the substrate component side 406. For example, the component redistribution layer 410 can include a laminated structure having electrical conductors for distributing electrical signals.

The system redistribution layer 412 is defined as an element for distributing electrical signals or potentials on the substrate system side 408. For example, the system redistribution layer 412 can include a laminated structure having electrical conductors for distributing electrical signals.

The component redistribution layer 410 is on the same side of the substrate 404 as the component redistribution layer 410. The system redistribution layer 412 is on the same side of the substrate 404 as the system redistribution layer 412. The substrate 404 can include electrical connections between the component redistribution layer 410 and the system redistribution layer 412 for transferring electrical signals to provide electrical connectivity between the component redistribution layer 410 and the system redistribution layer 412.

The base package 402 can include an integrated circuit 420, which is defined as a semiconductor device having a number of integrated transistors interconnected to form active circuits. The integrated circuit 420 can be mounted over the substrate 404. The integrated circuit 420 can include a flip chip die, a wire bond die, a complementary metal oxide semiconductor (CMOS) imaging sensor, a charge coupled device (CCD), or a combination thereof.

The integrated circuit 420 can include an image sensor 466. The image sensor 466 is defined as an element for receiving an image. The image sensor 466 can be formed on the side of the integrated circuit 420 facing away and opposite from the substrate 404.

The integrated circuit 420 can be connected to the component redistribution layer 410 with internal connectors 422 attached to the integrated circuit 420 and the component redistribution layer 410 of the substrate 404. The internal connectors 422 are defined as electrically conductive connectors for connecting an integrated circuit to another system level. For example, the internal connectors 422 can be electrically connected to the conductors of the component redistribution layer 410.

The integrated circuit 420 can be attached to the component redistribution layer 410 with an underfill 424. The underfill 424 is defined as an adhesive material applied between an electrical component and a mounting surface. The underfill 424 can include a non-conducting epoxy, an electrically insulating adhesive, an encapsulant, a resin, or a combination thereof. The underfill 424 can surround the internal connectors 422 providing mechanical support and also functioning to protect the connection between the integrated circuit 420 and the substrate 404. The underfill 424 is optional.

The integrated circuit 420 can include through silicon vias 421 (TSV). The through silicon vias 421 are defined as vertical conductor channels for conveying electrical signals from one side of the integrated circuit 420 to the other side.

The base package 402 can include the stiffener 430, which is defined as an element mounted over the substrate 404 for increasing the rigidity of the base package 402. The stiffener 430 can have a stiffener opening 426 completely through the structure.

For example, the stiffener 130 can be used to form an electromagnetic interference (EMI) shield. The stiffener 430 can be an electrically conductive element. The stiffener 430 can be formed from metal, an alloy, a laminate, plastic, or a combination thereof.

In another example, the stiffener 130 can be used to dissipate heat from the integrated circuit 120 via the substrate 404. The stiffener 430 can be formed from a metallic material, such as copper plated nickel, copper, nickel, an alloy, or a combination thereof. The stiffener 430 can be thermally coupled to the substrate 404 and the integrated circuit 420.

It is understood that the stiffener 430 can completely or partially surround the perimeter of the integrated circuit 420. The stiffener 430 can have different geometries including a rectangular geometry, a circular geometry, an oval geometry, including linear or arc shaped segments coupled to form a continuous geometry, or any combination thereof. The stiffener 430 may also be provided in a single body unit around the integrated circuit 420. For example, the stiffener 430 can be a continuous rectangular structure having the stiffener opening 426 completely through the structure forming a hollow rectangle with four side arms.

The stiffener 430 can surround the periphery of the integrated circuit 420 in a plane parallel to the horizontal plane. The periphery is defined as the outer limits or edge of an object. The integrated circuit 420 can be completely within the area defined by the periphery of the stiffener 430. The integrated circuit 420 can be positioned completely within the stiffener opening 426 of the stiffener 430.

The upper surface of the stiffener 430 is the surface facing away from the substrate 404. The stiffener 430 can have an inner upper periphery surface 432, which is defined as the portion of the upper surface of the stiffener 430 that is closest to the stiffener opening 426 of the stiffener 430. The stiffener 430 can have an outer upper periphery surface 434, which is defined as a portion of the upper surface of the stiffener 430 that furthest from the stiffener opening 426 of the stiffener 430. The inner upper periphery surface 432 can form a continuous non-vertical surface around the stiffener opening 426.

In another example, the stiffener 430 can be an insulating element. The stiffener 430 can be formed from plastic, ceramic, resin, or a combination thereof.

The stiffener 430 can be attached to the component redistribution layer 410 with a stiffener adhesive 438. The stiffener adhesive 438 is defined as a material for bonding the stiffener 430 with a mounting surface, such as the component redistribution layer 410.

In an EMI shielding example, the stiffener adhesive 438 can be electrically conductive to form an electrical connection between the stiffener 430 and the component redistribution layer 410. The stiffener 430, the stiffener adhesive 438, and the component redistribution layer 410 can form part of an EMI shield to reduce EMI noise.

In a mechanical stiffening example, the stiffener adhesive 438 can include an insulating material such as a polymer resin, plastic, or a combination thereof. The stiffener adhesive 438 can be directly on the component redistribution layer 410, including being directly on a conductor of the component redistribution layer 410.

The base package 402 can include a vertical interconnector 440, which is defined as an electrical conductor for forming an electrical and mechanical connection to the base package 402. The vertical interconnector 440 can include a solder ball, a solder post, a lead, conductive structure, a conductive post, a Z-interconnect, or a combination thereof. The vertical interconnector 440 can be directly on the component redistribution layer 410, including being directly on a conductor of the component redistribution layer 410.

In a specific example, the vertical interconnector 440 can convey electrical signals to the top of the base package 402. The vertical interconnector 440 can be used to supply signals to control the motion of a lens mounted over the image sensor 466. In another example, the vertical interconnector 440 can an optional component and can be omitted from the base package 402.

The base package 402 can include an encapsulation 442, which is defined as a package cover to hermetically seal an integrated circuit or other contents within the package cover for providing mechanical and environmental protection. The encapsulation 442 can be formed over the substrate 404 and a portion of the stiffener 430. The encapsulation 442 can be molded on the substrate 404 and completely outside the periphery of the integrated circuit 420. The encapsulation 442 can have an encapsulation opening 444 of FIG. 2 completely through the center of the encapsulation 442.

The encapsulation 442 can be formed over a portion of the vertical interconnector 440. The encapsulation 442 can expose a top portion of the vertical interconnector 440.

The encapsulation 442 can be formed with an electrically insulating material. For example, the encapsulation 442 includes a plastic resin, an electrically insulating material, or a combination thereof.

The encapsulation 442 can be formed directly on the component redistribution layer 410. The encapsulation 442 can be formed directly on the vertical interconnector 440. The encapsulation 442 can include an encapsulation inner sidewall 446, which is defined as the non-horizontal side of the encapsulation 442 that faces the encapsulation opening 444.

The encapsulation inner sidewall 446 can be formed with a molding process. The encapsulation inner sidewall can have the characteristics of being formed by a molding process, including having a smooth surface produced by a molding surface with no saw marks, abrasions from sawing or grinding, or burn marks from a laser process. For example, a mold can be used to form the encapsulation inner sidewall 446 and form a surface that is as smooth as the mold surface.

The encapsulation inner sidewall 446 can be formed over the stiffener 430. The encapsulation inner sidewall 446 can form a molded step of the encapsulation material over the outer upper periphery surface 434 the stiffener 430 and exposing the inner upper periphery surface 432 of the stiffener 430. The encapsulation 442 can be formed directly on the outer upper periphery surface 434 of the stiffener 430 and exposing the inner upper periphery surface 432 of the stiffener 430.

In a specific example, the encapsulation 442 can be formed with a resin applied to the substrate 404 outside of the periphery of the stiffener 430. The stiffener 430 can act as a mold dam and prevent the encapsulation material from entering the stiffener opening 426. The mold dam is defined as an element to prohibit the flow of the encapsulation material.

The encapsulation 442 can include an encapsulation top side 450, which is defined as a top surface of the encapsulation 442 on the side facing away from the substrate 404. A plane of the encapsulation top side 450 can be coplanar with a plane of the top of the vertical interconnector 440.

The base package 402 can include a lid plate 460 over the stiffener 430 and the integrated circuit 420. The lid plate 460 is defined as an element covering the stiffener opening 426 of the stiffener 430 and adjacent to the encapsulation inner sidewall 446.

For example, the lid plate 460 can form part of an optical sensor system. The lid plate 460 can be optically transparent to allow light to reach an imaging sensor on the integrated circuit 420.

The lid plate 460 can function as an optical transmission medium, an optical lens, an optical filter, or a combination thereof. The lid plate 460 can be formed from optically transparent material including a glass plate, a plastic plate, a composite plate, or a combination thereof.

The lid plate 460 can act as a transparent cover for the image sensor 466 of the integrated circuit 420. The lid plate 460 can be transparent to allow light from an image to reach the image sensor 466.

The lid plate 460 can be mounted on the inner upper periphery surface 432 of the stiffener 430 and adjacent to the encapsulation inner sidewall 446. The lid plate 460 is directly over the integrated circuit 420.

The lid plate 460 can be attached to the inner upper periphery surface 432 with a lid adhesive 462. The lid adhesive 462 is defined as a material for bonding the lid plate 460 to the inner upper periphery surface 432.

The lid adhesive 462 can be electrically conductive to form an electrical connection between the lid plate 460 and the stiffener 430. The lid adhesive 462 can include an insulating material such as a polymer resin, plastic, or a combination thereof.

The lid plate 460 can be mounted over the image sensor 466 of the integrated circuit 420 by mounting the lid plate 460 to the inner upper periphery surface 432. The lid plate 460 can be separated from the integrated circuit 420 by a vertical gap 468. The vertical gap 468 is defined as a space between the integrated circuit 420 and the lid plate 460.

For example, the lid adhesive 462 can be a transparent material if the lid plate 460 is transparent. In another example, the lid adhesive 462 can be omitted to provide a clear optical path if the integrated circuit 420 is an optical chip, such as a CMOS imaging senor, a CCD, or a combination thereof.

The base package 402 can include external connectors 470. The external connectors 470 are defined as electrically conductive elements for connecting the base package 402 to another system level, such as an external system, another package, a printed circuit board, an interposer, or a combination thereof.

The external connectors 470 can be electrically connected to the conductors of the system redistribution layer 412 of the substrate 404. The external connectors 470 can include solder balls, solder posts, leads, a conductive post, electrical connectors, sockets, pins, or a combination thereof.

The external connectors 470 can form an electrical connection to the conductors of the system redistribution layer 412, the component redistribution layer 410, the integrated circuit 420, the internal connectors 422, or a combination thereof.

It has been discovered that the present invention provides improved reliability by using the stiffener 430 as the mold dam to guide the formation and positioning of the encapsulation 442. The encapsulation 442 can be formed and shaped by the stiffener 430 to prevent the encapsulation from covering the electrical connections of the integrated circuit 420 and causing blocked electrical connections. The use of the stiffener 430 as the mold dam can simplify manufacturing my reducing the need to use additional mold dams to form and position the encapsulation 442.

It has been discovered that the present invention provides improved reliability by providing the inner upper periphery surface 432 surrounded by the encapsulation inner sidewall 446 for securely mounting the lid plate 460. Securely mounting the lid plate 460 can prevent the accidental mechanical separation of the lid plate 460 from the base package 402. The inner upper periphery surface 432 and the encapsulation inner sidewall 446 on the outer upper periphery surface 434 of the stiffener 430 combine to form an opening that can be used to securely mount the lid plate 460 thus providing a better seal, improved package stability, and easier manufacturing.

It has been discovered that the present invention provides improved package stability by mounting the lid plate 460 on the stiffener 430 with the lid adhesive 462. Attaching the lid plate 460 to the stiffener 430 creates a box-like structure with enhanced stability. The combination of the lid plate 460 and the stiffener 430 can prevent flexure of the base package 402 and reduce the chance of damaging an electrical solder connection.

It has been discovered that the present invention provides improved electromagnetic shielding. Connecting the lid plate 460 to the stiffener 430 using the lid adhesive 462 and the stiffener adhesive 438 that are electrically conductive can form an integrated electrical conductor around the integrated circuit 420. The lid plate 460 and the stiffener 430 can work together to reduce the amount of electrical interference transferred between the integrated circuit 420 and the exterior of the base package 402.

It has been discovered that the present invention provides a protected environment of the integrated circuit 420 with the stiffener 430 attached to the substrate 404, further attached to the lid plate 460 with the lid adhesive 462 and the stiffener adhesive 438. The stiffener 430 and the lid plate 460 form a hermetically sealed space that can prevent contamination or damage to the integrated circuit 420, thus protecting the integrated circuit 420.

It has been discovered that the present invention provides enhanced package integrity by forming the encapsulation 442 directly on the stiffener 430. The encapsulation 442 can form a rectangular structure with an opening formed by the stiffener 430. The rigidity of the encapsulation 442 can supplement the structural stability provided by the stiffener 430 to increase the overall stability of the base package 402 thus reducing warpage of the base package.

It has been discovered that the integrated circuit 420 provides improved reliability since it the integrated circuit 420 is a known good die (KGD), resulting in increased yield. By only using known good dies, the amount of rework can be reduced, increasing the level of reliability and simplifying manufacturing.

Figure 5:
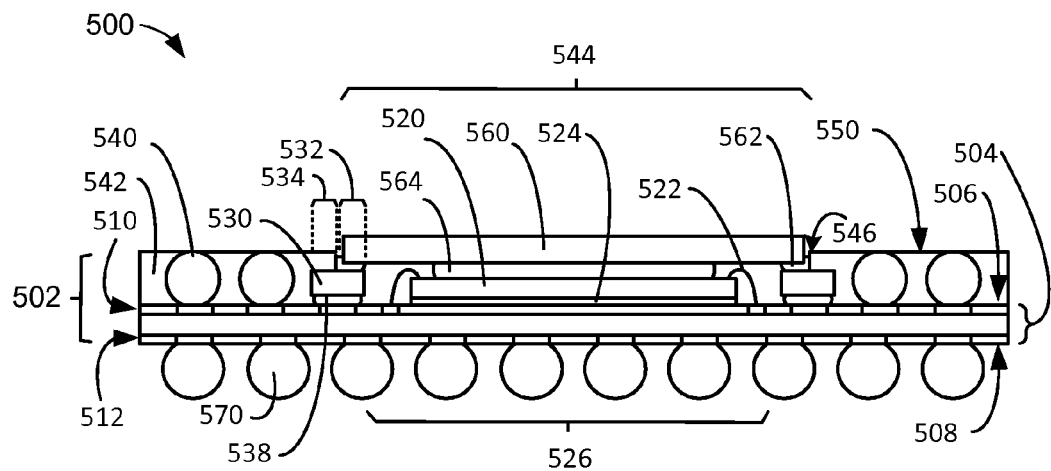
FIG. 5 is a cross-sectional view of an integrated circuit packaging system taken along a line 1-1 as exemplified by the top view of FIG. 2 in a third embodiment of the present invention.

Referring now to FIG. 5, therein is shown a cross-sectional view of an integrated circuit packaging system 500 taken along a line 1-1 as exemplified by the top view of FIG. 2 in a third embodiment of the present invention. The integrated circuit packaging system 500 can represent a pre-molded package-on-package-bottom (PoPb) with a stiffener 530 where an integrated circuit 520 is a wire bonded component.

The integrated circuit packaging system 500 can include a base package 502, which is defined as a semiconductor package. The integrated circuit packaging system 500 can include another package (not shown) that can be mounted over the base package 502.

The base package 502 can include a substrate 504. The substrate 504 is defined as a support structure for mounting and connecting an integrated circuit thereto including providing electrical connections through the support structure.

The substrate 504 can have a substrate component side 506 and a substrate system side 508 opposite the substrate component side 506. The substrate 504 can include a number of pads, vias, conductive layers, or a combination thereof to provide electrical connectivity between the substrate system side 508 and the substrate component side 506.

The substrate 504 can include a component redistribution layer 510 and a system redistribution layer 512. The component redistribution layer 510 is defined as an element for distributing electrical signals or potentials on the substrate component side 506. For example, the component redistribution layer 510 can include a laminated structure having electrical conductors for distributing electrical signals.

The system redistribution layer 512 is defined as an element for distributing electrical signals or potentials on the substrate system side 508. For example, the system redistribution layer 512 can include a laminated structure having electrical conductors for distributing electrical signals.

The component redistribution layer 510 is on the same side of the substrate 504 as the component redistribution layer 510. The system redistribution layer 512 is on the same side of the substrate 504 as the system redistribution layer 512. The substrate 504 can include electrical connections between the component redistribution layer 510 and the system redistribution layer 512 for transferring electrical signals to provide electrical connectivity between the component redistribution layer 510 and the system redistribution layer 512.

The base package 502 can include the integrated circuit 520, which is defined as a semiconductor device having a number of integrated transistors interconnected to form active circuits. The integrated circuit 520 can be mounted over the substrate 504. The integrated circuit 520 can include a wire bonded die, a flip chip die, a complementary metal oxide semiconductor (CMOS) imaging sensor, a charge coupled device (CCD), or a combination thereof.

The integrated circuit 520 can be connected to the component redistribution layer 510 with internal connectors 522 attached to the integrated circuit 520 and the component redistribution layer 510 of the substrate 504. The internal connectors 522 are defined as electrically conductive connectors for connecting an integrated circuit to another system level. The internal connectors 522 can include bond wires, leads, or a combination thereof. For example, the integrated circuit 520 can be electrically connected to the conductors of the component redistribution layer 510 with bond wires.

The integrated circuit 520 can be attached to the component redistribution layer 510 with an underfill 524. The underfill 524 is defined as an adhesive material applied between an electrical component and a mounting surface. The underfill 524 can include a non-conducting epoxy, an electrically insulating adhesive, an encapsulant, a resin, or a combination thereof. The underfill 524 can surround the internal connectors 522 providing mechanical support and also function to protect the connection between the integrated circuit 520 and the substrate 504. The underfill 524 is optional.

The base package 502 can include the stiffener 530, which is defined as an element mounted over the substrate 504 for increasing the rigidity of the base package 502. The stiffener 530 can have a stiffener opening 526 completely through the structure.

For example, the stiffener 130 can be used to form an electromagnetic interference (EMI) shield. The stiffener 530 can be an electrically conductive element. The stiffener 530 can be formed from metal, an alloy, a laminate, or a combination thereof.

In another example, the stiffener 130 can be used to dissipate heat from the integrated circuit 120 via the substrate 104. The stiffener 530 can be formed from a metallic material, such as copper plated nickel, copper, nickel, an alloy, or a combination thereof. The stiffener 530 can be thermally coupled to the substrate 504 and the integrated circuit 520.

It is understood that the stiffener 530 can completely or partially surround the perimeter of the integrated circuit 520. The stiffener 530 can have different geometries including a rectangular geometry, a circular geometry, an oval geometry, including linear or arc shaped segments coupled to form a continuous geometry, or any combination thereof. The stiffener 530 may also be provided in a single body unit around the integrated circuit 520. For example, the stiffener 530 can be a continuous rectangular structure having the stiffener opening 526 completely through the structure forming a hollow rectangle with four side arms.

The stiffener 530 can surround the periphery of the integrated circuit 520 in a plane parallel to the horizontal plane. The periphery is defined as the outer limits or edge of an object. The integrated circuit 520 can be completely within the area defined by the periphery of the stiffener 530. The integrated circuit 520 can be positioned completely within the stiffener opening 526 of the stiffener 530.

The upper surface of the stiffener 530 is the surface facing away from the substrate 504. The stiffener 530 can have an inner upper periphery surface 532, which is defined as the portion of the upper surface of the stiffener 530 that is closest to the stiffener opening 526 of the stiffener 530. The stiffener 530 can have an outer upper periphery surface 534, which is defined as a portion of the upper surface of the stiffener 530 that furthest from the stiffener opening 526 of the stiffener 530. The inner upper periphery surface 532 can form a continuous non-vertical surface around the stiffener opening 526.

In another example, the stiffener 530 can be an insulating element. The stiffener 530 can be formed from plastic, ceramic, resin, or a combination thereof.

The stiffener 530 can be attached to the component redistribution layer 510 with a stiffener adhesive 538. The stiffener adhesive 538 is defined as a material for bonding the stiffener 530 with a mounting surface, such as the component redistribution layer 510.

In an EMI shielding example, the stiffener adhesive 538 can be electrically conductive to form an electrical connection between the stiffener 530 and the component redistribution layer 510. The stiffener 530, the stiffener adhesive 538, and the component redistribution layer 510 can form part of an EMI shield to reduce EMI noise.

In a mechanical stiffening example, the stiffener adhesive 538 can include an insulating material such as a polymer resin, plastic, or a combination thereof. The stiffener adhesive 538 can be directly on the component redistribution layer 510, including being directly on a conductor of the component redistribution layer 510.

The base package 502 can include a vertical interconnector 540, which is defined as an electrical conductor for forming an electrical and mechanical connection to the base package 502. The vertical interconnector 540 can include a solder ball, a solder post, a lead, conductive structure, a conductive post, a Z-interconnect, or a combination thereof. The vertical interconnector 540 can be directly on the component redistribution layer 510, including being directly on a conductor of the component redistribution layer 510.

The base package 502 can include an encapsulation 542, which is defined as package cover to hermetically seal an integrated circuit or other contents within the package cover for providing mechanical and environmental protection. The encapsulation 542 can be formed over the substrate 504 and a portion of the stiffener 530. The encapsulation 542 can be molded on the substrate 504 and completely outside the periphery of the integrated circuit 520. The encapsulation 542 can have an encapsulation opening 544 of FIG. 2 completely through the center of the encapsulation 542.

The encapsulation 542 can be formed over a portion of the vertical interconnector 540. The encapsulation 542 can expose a top portion of the vertical interconnector 540.

The encapsulation 542 can be formed with an electrically insulating material. For example, the encapsulation 542 can include a thermo-plastic resin, an electrically insulating material, or a combination thereof.

The encapsulation 542 can be formed directly on the component redistribution layer 510. The encapsulation 542 can be formed directly on the vertical interconnector 540. The encapsulation 542 can include an encapsulation inner sidewall 546, which is defined as the non-horizontal side of the encapsulation 542 that faces the encapsulation opening 544.

The encapsulation inner sidewall 546 can be formed with a molding process. The encapsulation inner sidewall can have the characteristics of being formed by a molding process, including having a smooth surface produced by a molding surface with no saw marks, abrasions from sawing or grinding, or burn marks from a laser process. For example, a mold can be used to form the encapsulation inner sidewall 546 and form a surface that is as smooth as the mold surface.

The encapsulation inner sidewall 546 can be formed over the stiffener 530. The encapsulation inner sidewall 546 can form a molded step of the encapsulation material over the outer upper periphery surface 534 the stiffener 530 and exposing the inner upper periphery surface 532 of the stiffener 530. The encapsulation 542 can be formed directly on the outer upper periphery surface 534 of the stiffener 530 and exposing the inner upper periphery surface 532 of the stiffener 530.

In a specific example, the encapsulation 542 can be formed with a resin applied to the substrate 504 outside of the periphery of the stiffener 530. The stiffener 530 can act as a mold dam and prevent the encapsulation material from entering the stiffener opening 526. The mold dam is defined as an element to prohibit the flow of the encapsulation material.

The encapsulation 542 can include an encapsulation top side 550, which is defined as a top surface of the encapsulation 542 on the side facing away from the substrate 504. A plane of the encapsulation top side 550 can be coplanar with a plane of the top of the vertical interconnector 540.

The base package 502 can include a lid plate 560 over the stiffener 530. The lid plate 560 is defined as an element covering the stiffener opening 526 of the stiffener 530 and adjacent to the encapsulation inner sidewall 546.

For example, the lid plate 560 can form part of a thermal dissipation system. The lid plate 560 can be thermally coupled to the stiffener 530, the substrate 504 and the integrated circuit 520. Heat can flow from the integrated circuit 520 to the lid plate 560 to be dissipated by convection or radiation.

The lid plate 560 can function as a heat sink, a heat slug, a thermal radiator, a thermal transfer unit, or a combination thereof. The lid plate 560 can be formed from a thermally conductive material including a metal plate, a ceramic plate, a composite plate, or a combination thereof.

In another example, the lid plate 560 can form part of an electromagnetic interference (EMI) shield. The lid plate 560 can be electrically coupled to the stiffener 530 and the substrate 504. The lid plate 560 can be coupled to an electrical ground connection. The lid plate can be formed from an electrically conductive material such as a metal, an alloy, or a combination thereof.

The lid plate 560 can be mounted on the inner upper periphery surface 532 of the stiffener 530 and adjacent to the encapsulation inner sidewall 546. The lid plate 560 can be mounted directly over the integrated circuit 520.

The lid plate 560 can be attached to the inner upper periphery surface 532 with a lid adhesive 562. The lid adhesive 562 is defined as a material for bonding the lid plate 560 to the inner upper periphery surface 532.

The lid adhesive 562 can be electrically conductive to form an electrical connection between the lid plate 560 and the stiffener 530. The lid adhesive 562 can include an insulating material such as a polymer resin, plastic, or a combination thereof.

The lid plate 560 can be attached to the integrated circuit 520 with a chip adhesive 564. The chip adhesive 564 is defined as a material for bonding the lid plate 560 to the integrated circuit 520. The chip adhesive 564 can form a layer between the lid plate 560 and the integrated circuit 520. The chip adhesive 564 can include a thermal interface material, an epoxy, a resin, a thermal paste, an electrically conductive paste, a polymer, or a combination thereof.

The base package 502 can include external connectors 570. The external connectors 570 are defined as electrically conductive elements for connecting the base package 502 to another system level, such as an external system, another package, a printed circuit board, an interposer, or a combination thereof.

The external connectors 570 can be electrically connected to the conductors of the system redistribution layer 512 of the substrate 504. The external connectors 570 can include solder balls, solder posts, leads, a conductive post, electrical connectors, sockets, pins, or a combination thereof.

The external connectors 570 can form an electrical connection to the conductors of the system redistribution layer 512, the component redistribution layer 510, the integrated circuit 520, the internal connectors 522, or a combination thereof.

It has been discovered that the present invention provides improved reliability by using the stiffener 530 as the mold dam to guide the formation and positioning of the encapsulation 542. The encapsulation 542 can be formed and shaped by the stiffener 530 to prevent the encapsulation from covering the electrical connections of the integrated circuit 520 and causing blocked electrical connections. The use of the stiffener 530 as the mold dam can simplify manufacturing my reducing the need to use additional mold dams to form and position the encapsulation 542.

It has been discovered that the present invention provides improved reliability by providing the inner upper periphery surface 532 surrounded by the encapsulation inner sidewall 546 for securely mounting the lid plate 560. Securely mounting the lid plate 560 can prevent the accidental mechanical separation of the lid plate 560 from the base package 502. The inner upper periphery surface 532 and the encapsulation inner sidewall 546 on the outer upper periphery surface 534 of the stiffener 530 combine to form an opening that can be used to securely mount the lid plate 560 thus providing a better seal, improved package stability, and easier manufacturing.

It has been discovered that the present invention provides improved package stability by mounting the lid plate 560 on the stiffener 530 with the lid adhesive 562. Attaching the lid plate 560 to the stiffener 530 creates a box-like structure with enhanced stability. The combination of the lid plate 560 and the stiffener 530 can prevent flexure of the base package 502 and reduce the chance of damaging an electrical solder connection.

It has been discovered that the present invention provides improved electromagnetic shielding. Connecting the lid plate 560 to the stiffener 530 using the lid adhesive 562 and the stiffener adhesive 538 that are electrically conductive can form an integrated electrical conductor around the integrated circuit 520. The lid plate 560 and the stiffener 530 can work together to reduce the amount of electrical interference transferred between the integrated circuit 520 and the exterior of the base package 502.

It has been discovered that present invention provides improved thermal performance and cooling. By attaching the integrated circuit 520 to the lid plate 560 with the chip adhesive 564 allows increased transfer of heat from the integrated circuit 520 to the lid plate 560 and the stiffener 530. The chip adhesive 564 provides a large surface area for the transfer of heat from the integrated circuit 520 to the lid plate 560 where the heat can be dissipated by radiation or convection, thus acting as a heat sink or a heat slug.

It has been discovered that the present invention provides a protected environment of the integrated circuit 520 with the stiffener 530 attached to the substrate 504, further attached to the lid plate 560 with the lid adhesive 562 and the stiffener adhesive 538. The stiffener 530 and the lid plate 560 form a hermetically sealed space that can prevent contamination or damage to the integrated circuit 520, thus protecting the integrated circuit 520.

It has been discovered that the present invention provides enhanced package integrity by forming the encapsulation 542 directly on the stiffener 530. The encapsulation 542 can form a rectangular structure with an opening formed by the stiffener 530. The rigidity of the encapsulation 542 can supplement the structural stability provided by the stiffener 530 to increase the overall stability of the base package 502 thus reducing warpage of the base package.

It has been discovered that the integrated circuit 520 provides improved reliability since it the integrated circuit 520 is a known good die (KGD), resulting in increased yield.

Figure 6:
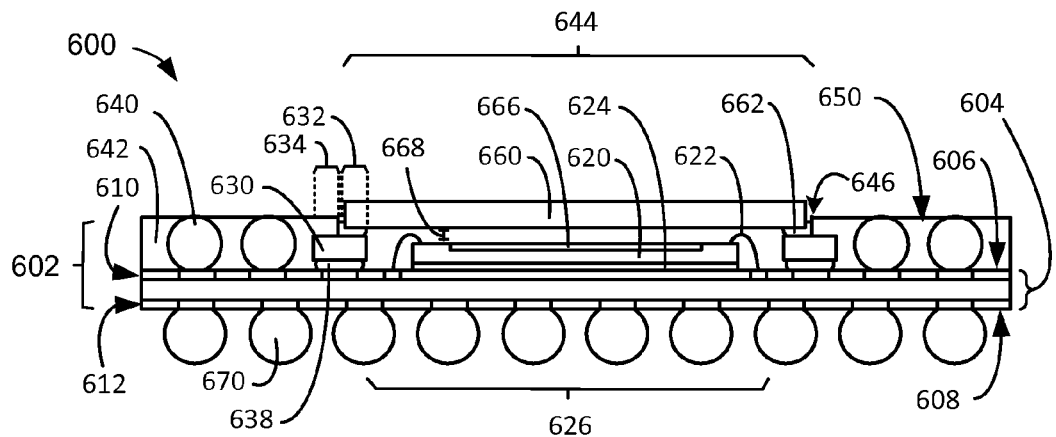
FIG. 6 is a cross-sectional view of an integrated circuit packaging system taken along a line 1-1 as exemplified by the top view of FIG. 2 in a fourth embodiment of the present invention.

Referring now to FIG. 6, therein is shown a cross-sectional view of an integrated circuit packaging system 600 taken along a line 1-1 as exemplified by the top view of FIG. 2 in a fourth embodiment of the present invention. The integrated circuit packaging system 600 can represent a pre-molded package-on-package-bottom (PoPb) with a stiffener 630 where an integrated circuit 620 is a wire bonded component.

The integrated circuit packaging system 600 can include a base package 602, which is defined as a semiconductor package. The integrated circuit packaging system 600 can include another package (not shown) that can be mounted over the base package 602.

The base package 602 can include a substrate 604. The substrate 604 is defined as a support structure for mounting and connecting an integrated circuit thereto including providing electrical connections through the support structure.

The substrate 604 can have a substrate component side 606 and a substrate system side 608 opposite the substrate component side 606. The substrate 604 can include a number of pads, vias, conductive layers, or a combination thereof to provide electrical connectivity between the substrate system side 608 and the substrate component side 606.

The substrate 604 can include a component redistribution layer 610 and a system redistribution layer 612. The component redistribution layer 610 is defined as an element for distributing electrical signals or potentials on the substrate component side 606. For example, the component redistribution layer 610 can include a laminated structure having electrical conductors for distributing electrical signals.

The system redistribution layer 612 is defined as an element for distributing electrical signals or potentials on the substrate system side 608. For example, the system redistribution layer 612 can include a laminated structure having electrical conductors for distributing electrical signals.

The component redistribution layer 610 is on the same side of the substrate 604 as the component redistribution layer 610. The system redistribution layer 612 is on the same side of the substrate 604 as the system redistribution layer 612. The substrate 604 can include electrical connections between the component redistribution layer 610 and the system redistribution layer 612 for transferring electrical signals to provide electrical connectivity between the component redistribution layer 610 and the system redistribution layer 612.

The base package 602 can include the integrated circuit 620, which is defined as a semiconductor device having a number of integrated transistors interconnected to form active circuits. The integrated circuit 620 can be mounted over the substrate 604. The integrated circuit 620 can include a wire bonded die, a flip chip die, complementary metal oxide semiconductor (CMOS) imaging sensor, a charge coupled device (CCD), or a combination thereof.

The integrated circuit 620 can include an image sensor 666. The image sensor 666 is defined as an element for receiving an image. The image sensor 666 can be formed on the side of the integrated circuit 620 facing away and opposite from the substrate 604.

The integrated circuit 620 can be connected to the component redistribution layer 610 with internal connectors 622 attached to the integrated circuit 620 and the component redistribution layer 610 of the substrate 604. The internal connectors 622 are defined as electrically conductive connectors for connecting an integrated circuit to another system level. For example, the internal connectors 622 can be electrically connected to the conductors of the component redistribution layer 610. The internal connectors 622 can be bond wires, leads, or a combination thereof.

The integrated circuit 620 can be attached to the component redistribution layer 610 with an underfill 624. The underfill 624 is defined as an adhesive material applied between an electrical component and a mounting surface. The underfill 624 can include a non-conducting epoxy, an adhesive, an encapsulant, a resin, or a combination thereof. The underfill 624 can surround the internal connectors 622 providing mechanical support and also function to protect the connection between the integrated circuit 620 and the substrate 604. The underfill 624 is optional.

The base package 602 can include the stiffener 630, which is defined as an element mounted over the substrate 604 for increasing the rigidity of the base package 602. The stiffener 630 can have a stiffener opening 626 completely through the structure.

For example, the stiffener 630 can be used to form an electromagnetic interference (EMI) shield. The stiffener 630 can be an electrically conductive element. The stiffener 630 can be formed from metal, an alloy, a laminate, plastic, or a combination thereof.

In another example, the stiffener 630 can be used to dissipate heat from the integrated circuit 620 via the substrate 604. The stiffener 630 can be formed from a metallic material, such as copper plated nickel, copper, nickel, an alloy, or a combination thereof. The stiffener 630 can be thermally coupled to the substrate 604. It is understood that the stiffener 630 can completely or partially surround the perimeter of the integrated circuit 620. The stiffener 630 can have different geometries including a rectangular geometry, a circular geometry, an oval geometry, including linear or arc shaped segments coupled to form a continuous geometry, or any combination thereof. The stiffener 630 may also be provided in a single body unit around the integrated circuit 620. For example, the stiffener 630 can be a continuous rectangular structure having the stiffener opening 626 completely through the structure forming a hollow rectangle with four side arms.

The stiffener 630 can surround the periphery of the integrated circuit 620 in a plane parallel to the horizontal plane. The periphery is defined as the outer limits or edge of an object. The integrated circuit 620 can be completely within the area defined by the periphery of the stiffener 630. The integrated circuit 620 can be positioned completely within the stiffener opening 626 of the stiffener 630.

The upper surface of the stiffener 630 is the surface facing away from the substrate 604. The stiffener 630 can have an inner upper periphery surface 632, which is defined as the portion of the upper surface of the stiffener 630 that is closest to the stiffener opening 626 of the stiffener 630. The stiffener 630 can have an outer upper periphery surface 634, which is defined as a portion of the upper surface of the stiffener 630 that furthest from the stiffener opening 626 of the stiffener 630. The inner upper periphery surface 632 can form a continuous non-vertical surface around the stiffener opening 626.

In another example, the stiffener 630 can be an insulating element. The stiffener 630 can be formed from plastic, ceramic, resin, or a combination thereof.

The stiffener 630 can be attached to the component redistribution layer 610 with a stiffener adhesive 638. The stiffener adhesive 638 is defined as a material for bonding the stiffener 630 with a mounting surface, such as the component redistribution layer 610.

In an EMI shielding example, the stiffener adhesive 638 can be electrically conductive to form an electrical connection between the stiffener 630 and the component redistribution layer 610. The stiffener 430, the stiffener adhesive 438, and the component redistribution layer 410 can form part of an EMI shield to reduce EMI noise.

In a mechanical stiffening example, the stiffener adhesive 638 can include an insulating material such as a polymer resin, plastic, or a combination thereof. The stiffener adhesive 638 can be directly on the component redistribution layer 610, including being directly on a conductor of the component redistribution layer 610.

The base package 602 can include a vertical interconnector 640, which is defined as an electrical conductor for forming an electrical and mechanical connection to the base package

602. The vertical interconnector 640 can include a solder ball, a solder post, a lead, conductive structure, a conductive post, a Z-interconnect, or a combination thereof. The vertical interconnector 640 can be directly on the component redistribution layer 610, including being directly on a conductor of the component redistribution layer 610.

In a specific example, the vertical interconnector 640 can convey electrical signals to the top of the base package 602. The vertical interconnector 640 can be used to supply signals to control the motion of a lens mounted over the image sensor 666. In another example, the vertical interconnector 640 can an optional component and can be omitted from the base package 602.

The base package 602 can include an encapsulation 642, which is defined as a package cover to hermetically seal an integrated circuit or other contents within the package cover for providing mechanical and environmental protection. The encapsulation 642 can be formed over the substrate 604 and a portion of the stiffener 630. The encapsulation 642 can be molded on the substrate 604 and completely outside the periphery of the integrated circuit 620. The encapsulation 642 can have an encapsulation opening 644 of FIG. 2 completely through the center of the encapsulation 642.

The encapsulation 642 can be formed over a portion of the vertical interconnector 640. The encapsulation 642 can expose a top portion of the vertical interconnector 640.

The encapsulation 642 can be formed with an electrically insulating material. For example, the encapsulation 642 includes a thermo-plastic resin, an electrically insulating material, or a combination thereof.

The encapsulation 642 can be formed directly on the component redistribution layer 610. The encapsulation 642 can be formed directly on the vertical interconnector 640. The encapsulation 642 can include an encapsulation inner sidewall 646, which is defined as the non-horizontal side of the encapsulation 642 that faces the encapsulation opening 644.

The encapsulation inner sidewall 646 can be formed with a molding process. The encapsulation inner sidewall can have the characteristics of being formed by a molding process, including having a smooth surface produced by a molding surface with no saw marks, abrasions from sawing or grinding, or burn marks from a laser process. For example, a mold can be used to form the encapsulation inner sidewall 646 and form a surface that is as smooth as the mold surface.

The encapsulation inner sidewall 646 can be formed over the stiffener 630. The encapsulation inner sidewall 646 can form a molded step of the encapsulation material over the outer upper periphery surface 634 the stiffener 630 and exposing the inner upper periphery surface 632 of the stiffener 630. The encapsulation 642 can be formed directly on the outer upper periphery surface 634 of the stiffener 630 and exposing the inner upper periphery surface 632 of the stiffener 630.

In a specific example, the encapsulation 642 can be formed with a resin applied to the substrate 604 outside of the periphery of the stiffener 630. The stiffener 630 can act as a mold dam and prevent the encapsulation material from entering the stiffener opening 626. The mold dam is defined as an element to prohibit the flow of the encapsulation material.

The encapsulation 642 can include an encapsulation top side 650, which is defined as a top surface of the encapsulation 642 on the side facing away from the substrate 604. A plane of the encapsulation top side 650 can be coplanar with a plane of the top of the vertical interconnector 640.

The base package 602 can include a lid plate 660 over the stiffener 630 and the integrated circuit 620. The lid plate 660 is defined as an element covering the stiffener opening 626 of the stiffener 630 and adjacent to the encapsulation inner sidewall 646.

For example, the lid plate 660 can form part of an optical sensor system. The lid plate 660 can be optically transparent to allow light to reach an imaging sensor on the integrated circuit 620.

The lid plate 660 can function as an optical transmission medium, an optical lens, an optical filter, or a combination thereof. The lid plate 660 can be formed from optically transparent material including a glass plate, a plastic plate, a composite plate, or a combination thereof.

The lid plate 660 can include a transparent plate, a glass plate, a plastic plate, a ceramic plate, a composite plate, or a combination thereof. The lid plate 660 can act as a transparent cover for the image sensor 666 of the integrated circuit 620. The lid plate 660 can be transparent to allow light from an image to reach the image sensor 666.

The lid plate 660 can be mounted on the inner upper periphery surface 632 of the stiffener 630 and adjacent to the encapsulation inner sidewall 646. The lid plate 660 is directly over the integrated circuit 620.

The lid plate 660 can be attached to the inner upper periphery surface 632 with a lid adhesive 662. The lid adhesive 662 is defined as a material for bonding the lid plate 660 to the inner upper periphery surface 632.

The lid adhesive 662 can be electrically conductive to form an electrical connection between the lid plate 660 and the stiffener 630. The lid adhesive 662 can include an insulating material such as a polymer resin, plastic, or a combination thereof.

The lid plate 660 can be mounted over the image sensor 466 of the integrated circuit 620 by mounting the lid plate 660 to the inner upper periphery surface 632. The lid plate 660 can be separated from the integrated circuit 620 by a vertical gap 668. The vertical gap 668 is defined as a space between the integrated circuit 620 and the lid plate 660.

For example, the lid adhesive 662 can be a transparent material if the lid plate 660 is transparent. In another example, the lid adhesive 662 can be omitted to provide a clear optical path if the integrated circuit 620 is an optical chip, such as a CMOS imaging senor, a CCD, or a combination thereof.

The base package 602 can include external connectors 670. The external connectors 670 are defined as electrically conductive elements for connecting the base package 602 to another system level, such as an external system, another package, a printed circuit board, an interposer, or a combination thereof.

The external connectors 670 can be electrically connected to the conductors of the system redistribution layer 612 of the substrate 604. The external connectors 670 can include solder balls, solder posts, leads, a conductive post, electrical connectors, sockets, pins, or a combination thereof.

The external connectors 670 can form an electrical connection to the conductors of the system redistribution layer 612, the component redistribution layer 610, the integrated circuit 620, the internal connectors 622, or a combination thereof.

It has been discovered that the present invention provides improved reliability by using the stiffener 630 as the mold dam to guide the formation and positioning of the encapsulation 642. The encapsulation 642 can be formed and shaped by the stiffener 630 to prevent the encapsulation from covering the electrical connections of the integrated circuit 620 and causing blocked electrical connections. The use of the stiffener 630 as the mold dam can simplify manufacturing my reducing the need to use additional mold dams to form and position the encapsulation 642.

It has been discovered that the present invention provides improved reliability by providing the inner upper periphery surface 632 surrounded by the encapsulation inner sidewall 646 for securely mounting the lid plate 660. Securely mounting the lid plate 660 can prevent the accidental mechanical separation of the lid plate 660 from the base package 602. The inner upper periphery surface 632 and the encapsulation inner sidewall 646 on the outer upper periphery surface 634 of the stiffener 630 combine to form an opening that can be used to securely mount the lid plate 660 thus providing a better seal, improved package stability, and easier manufacturing.

It has been discovered that the present invention provides improved package stability by mounting the lid plate 660 on the stiffener 630 with the lid adhesive 662. Attaching the lid plate 660 to the stiffener 630 creates a box-like structure with enhanced stability. The combination of the lid plate 660 and the stiffener 630 can prevent flexure of the base package 602 and reduce the chance of damaging an electrical solder connection.

It has been discovered that the present invention provides improved electromagnetic shielding. Connecting the lid plate 660 to the stiffener 630 using the lid adhesive 662 and the stiffener adhesive 638 that are electrically conductive can form an integrated electrical conductor around the integrated circuit 620. The lid plate 660 and the stiffener 630 can work together to reduce the amount of electrical interference transferred between the integrated circuit 620 and the exterior of the base package 602.

It has been discovered that the present invention provides a protected environment of the integrated circuit 620 with the stiffener 630 attached to the substrate 604, further attached to the lid plate 660 with the lid adhesive 662 and the stiffener adhesive 638. The stiffener 630 and the lid plate 660 form a hermetically sealed space that can prevent contamination or damage to the integrated circuit 620, thus protecting the integrated circuit 620.

It has been discovered that the present invention provides enhanced package integrity by forming the encapsulation 642 directly on the stiffener 630. The encapsulation 642 can form a rectangular structure with an opening formed by the stiffener 630. The rigidity of the encapsulation 642 can supplement the structural stability provided by the stiffener 630 to increase the overall stability of the base package 602 thus reducing warpage of the base package.

It has been discovered that the integrated circuit 620 provides improved reliability since it the integrated circuit 620 is a known good die (KGD), resulting in increased yield. By only using known good dies, the amount of rework can be reduced, increasing the level of reliability and simplifying manufacturing.

Figure 7:
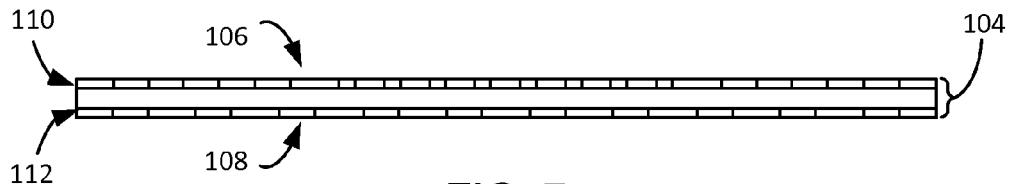
FIG. 7 is a cross-sectional view of the substrate in a forming phase of manufacture of the integrated circuit packaging system.

Referring now to FIG. 7, therein is shown the substrate 104 in a forming phase of manufacture of the integrated circuit packaging system 100 of FIG. 1. The integrated circuit packaging system 100 can be formed with the substrate 104 having the component redistribution layer 110 and the system redistribution layer 112.

The substrate 104 can be provided with the component redistribution layer 110 on the substrate component side 106 of the substrate and the system redistribution layer 112 on the substrate system side 108 of the substrate 104. The component redistribution layer 110 can be electrically connected to the system redistribution layer 112.

Figure 8:
FIG. 8 is the structure of FIG. 7 in a first mounting phase of manufacture.

Referring now to FIG. 8, therein is shown the structure of FIG. 7 in a first mounting phase of manufacture. The integrated circuit packaging system 100 of FIG. 1 can include a first attach method to attach the stiffener 130 over the component redistribution layer 110 and the vertical interconnector 140.

The integrated circuit packaging system 100 can include the stiffener 130 mounted to the component redistribution layer 110 with the stiffener adhesive 138. The stiffener adhesive 138 can be formed directly on the component redistribution layer 110. For example, the stiffener adhesive 138 can be formed directly on a conductor of the component redistribution layer 110. The stiffener 130 can be attached directly on the stiffener adhesive 138.

The integrated circuit packaging system 100 can include the vertical interconnector 140 mounted directly on the conductor of the component redistribution layer 110. For example, the vertical interconnector 140 can be solder balls formed directly on the conductor of the component redistribution layer 110.

Figure 9:
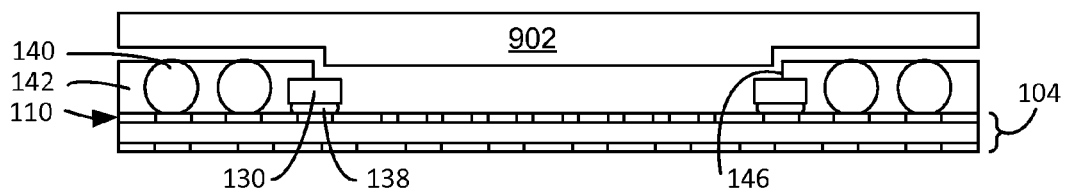
FIG. 9 is the structure of FIG. 8 in a molding phase of manufacture.

Referring now to FIG. 9, therein is shown the structure of FIG. 8 in a molding phase of manufacture. The integrated circuit packaging system 100 of FIG. 1 can include a molding method to form the encapsulation 142 over the substrate 104 and directly on a portion of the vertical interconnector 140 and a portion of the stiffener 130. The encapsulation 142 can be molded over the substrate 104 using a top mold chase 902. The top mold chase 902 is defined as part of an enclosure forming the cavity of a mold.

The top mold chase 902 combined with the stiffener 130 and the stiffener adhesive 138 form a continuous barrier around the inner perimeter of the stiffener 130. The top mold chase 902, the stiffener 130 and the stiffener adhesive 138 form the inner wall of the mold and define the encapsulation inner sidewall 146.

The integrated circuit packaging system 100 can include the encapsulation 142 molded over the substrate 104 and a portion of the vertical interconnector 140 and a portion of the stiffener 130. The encapsulation 142 is pre-molded before the integrated circuit 120 of FIG. 1 is attached to the component redistribution layer 110.

The encapsulation 142 can be molded using a variety of methods. For example, the encapsulation 142 can be molded using a conventional mold with an elastomer center attached portion. In another example, the encapsulation 142 can be molded using a film assisted mold with a center-protruded version of the top mold chase 902.

The encapsulation 142 can be molded to form the encapsulation inner sidewalls 146 against the top mold chase 902. The top mold chase 902 can be directly on the interior periphery of the stiffener 130 to mold the encapsulation 142 only on the outer periphery of the stiffener 130. The top mold chase 902 can include a center-protruded top mold chase.

The encapsulation 142 can be molded directly on a portion of the vertical interconnector 140 and exposing the top of the vertical interconnector 140. The encapsulation 142 can be directly on the stiffener 130 and the vertical interconnector 140. The encapsulation 142 can be directly on the component redistribution layer 110 and the stiffener adhesive 138.

The encapsulation 142 can form a molded step over the stiffener 130 with the encapsulation 142 directly on the exterior periphery of the stiffener 130 and the interior periphery of the stiffener 130 exposed and not covered with the encapsulation 142.

It has been discovered that the present invention provides improved reliability by using the stiffener 130 as the mold dam of FIG. 1 to guide the formation and positioning of the encapsulation 142. The encapsulation 142 can be formed and shaped by the stiffener 130 to prevent the encapsulation from covering the electrical connections of the integrated circuit 120 and causing blocked electrical connections. The use of the stiffener 130 as the mold dam can simplify manufacturing my reducing the need to use additional mold dams to form and position the encapsulation 142.

It has been discovered that the present invention provides improved reliability by providing a molded step on the outer upper periphery surface 134 of FIG. 1 of the stiffener 130 for securely mounting the lid plate 160 of FIG. 1. Securely mounting the lid plate 160 can prevent the accidental mechanical separation of the lid plate 160 from the base package 102 of FIG. 1. Forming the encapsulation 142 on the outer periphery of the stiffener 130 forms an opening on the inner periphery of the stiffener 130 that can be used to securely mount the lid plate 160 thus providing a better seal, improved package stability, and easier manufacturing.

Figure 10:
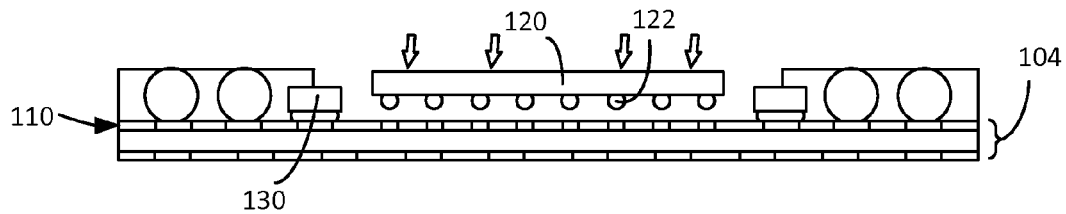
FIG. 10 is the structure of FIG. 9 in a second mounting phase of manufacture.

Referring now to FIG. 10, therein is shown the structure of FIG. 9 in a second mounting phase of manufacture. The integrated circuit packaging system 100 of FIG. 1 can include a mounting method to mount the integrated circuit 120 on the component redistribution layer 110 within the interior periphery of the stiffener 130.

The integrated circuit packaging system 100 can include the integrated circuit 120 mounted to the component redistribution layer 110 within the interior periphery of the stiffener 130. The integrated circuit 120 can include the internal interconnectors 122 connecting the integrated circuit 120 to the conductors of the component redistribution layer 110. The integrated circuit 120 can be mounted on the component redistribution layer 110 by moving the integrated circuit 120 in the direction as shown by the arrows in FIG. 10.

The integrated circuit 120 can form an electrical connection to the component redistribution layer 110 with the internal interconnectors 122. The stiffener 130 can completely surround the periphery of the integrated circuit 120. The integrated circuit 120 can be completely within the perimeter of the stiffener 130.

Figure 11:
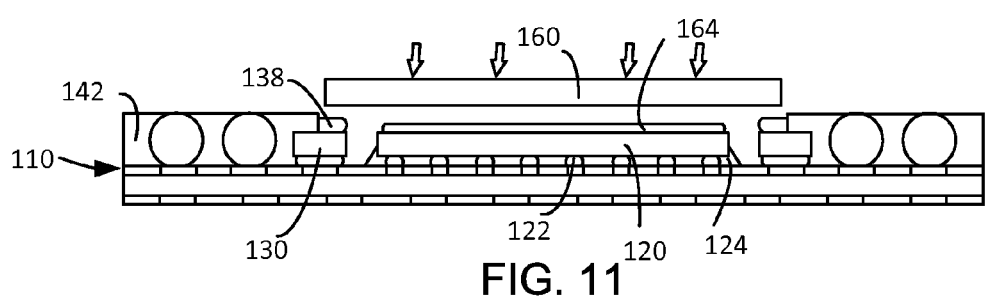
FIG. 11 is the structure of FIG. 10 in a first attaching phase of manufacture.

Referring now to FIG. 11, therein is shown the structure of FIG. 10 in a first attaching phase of manufacture. The integrated circuit packaging system 100 of FIG. 1 can include an attaching method to attach the lid plate 160 to the inner upper periphery surface 132 of FIG. 1 of the stiffener 130.

The integrated circuit packaging system 100 can include the integrated circuit 120 attached to the component redistribution layer 110 within the perimeter of the stiffener 130 with the underfill 124. The underfill 124 can be between the component redistribution layer 110 and the top of the integrated circuit 120. The underfill 124 can surround the internal interconnectors 122. The lid plate 160 can be attached to the inner upper periphery surface 132 by moving the lid plate 160 in the direction as shown by the arrows in FIG. 11.

The integrated circuit packaging system 100 can include attaching the lid plate 160 to the inner upper periphery surface 132 of FIG. 1 of the stiffener 130 and over the integrated circuit 120. The lid plate 160 can be mounted on the inner upper periphery surface 132 of the stiffener 130 with the lid adhesive 162. The lid adhesive 162 can be directly on the inner upper periphery surface 132 of the stiffener 130 and directly on the lid plate 160.

The lid plate 160 can be attached to the integrated circuit 120 with the chip adhesive 164. The chip adhesive 164 can be directly on the integrated circuit 120 and directly on the lid plate 160.

The lid plate 160 can be mounted on the stiffener 130 and adjacent to the encapsulation inner sidewalls 146 of FIG. 1. The sides of the lid plate 160 can face the encapsulation inner sidewalls 146.

It has been discovered that the present invention provides improved electromagnetic shielding. Connecting the lid plate 160 to the stiffener 130 using the lid adhesive 162 and the stiffener adhesive 138 that are electrically conductive can form an integrated electrical conductor around the integrated circuit 120. The lid plate 160 and the stiffener 130 can work together to reduce the amount of electrical interference transferred between the integrated circuit 120 and the exterior of the base package 102 of FIG. 1.

It has been discovered that present invention provides improved thermal performance and cooling. By attaching the integrated circuit 120 to the lid plate 160 with the chip adhesive 164 allows increased transfer of heat from the integrated circuit 120 to the lid plate 160 and the stiffener 130. The chip adhesive 164 provides a large surface area for the transfer of heat from the integrated circuit 120 to the lid plate 160 where the heat can be dissipated by radiation or convection, thus acting as a heat sink or a heat slug.

It has been discovered that the present invention provides a more secure attachment of the lid plate 160 to the integrated circuit 120 and the stiffener 130 by mounting the lid plate 160 on the integrated circuit 120 with the chip adhesive 164 and the stiffener 130 with the stiffener 130 adhesive.

It has been discovered that the present invention provides a protected environment of the integrated circuit 120 with the stiffener 130 attached to the substrate 104, further attached to the lid plate 160 with the lid adhesive 162 and the stiffener adhesive 138. The stiffener 130 and the lid plate 160 form a hermetically sealed space that can prevent contamination or damage to the integrated circuit 120, thus protecting the integrated circuit 120.

It has been discovered that the present invention provides enhanced package integrity by forming the encapsulation 142 directly on the stiffener 130. The encapsulation 142 can form a rectangular structure with an opening formed by the stiffener 130. The rigidity of the encapsulation 142 can supplement the structural stability provided by the stiffener 130 to increase the overall stability of the base package 102 thus reducing warpage of the base package.

Figure 12:
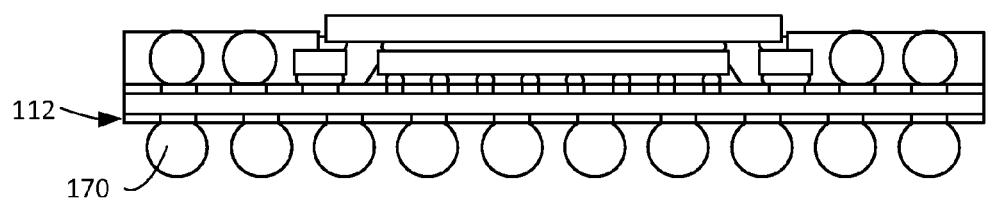
FIG. 12 is the structure of FIG. 11 in a second attaching phase of manufacture.

Referring now to FIG. 12, therein is shown the structure of FIG. 11 in a second attaching phase of manufacture. The integrated circuit packaging system 100 of FIG. 1 can include an attaching method to attach the external connectors 170 attached directly on the system redistribution layer 112.

The external connectors 170 can be attached directly to the conductors of the system redistribution layer 112. The external connectors 170 can be attached in a variety of ways. For example, the external connectors 170, such as solder balls, can be formed directly on the conductors of the system redistribution layer 112 forming an electrical connection with the system redistribution layer 112. In another example, the external connectors 170 can be formed separately and attached to the system redistribution layer 112 using solder, an electrically conducting adhesive, or a combination thereof.

Figure 13:
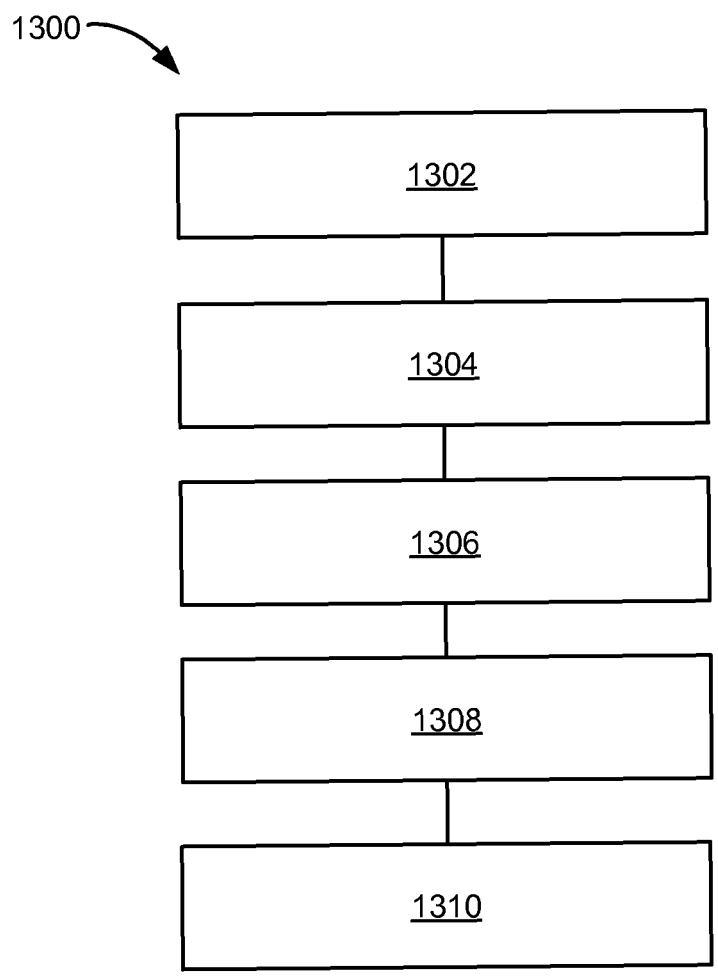
FIG. 13 is a flow chart of a method of manufacture of the integrated circuit packaging system in a further embodiment of the present invention.

Referring now to FIG. 13, therein is shown a flow chart of a method 1300 of manufacture of an integrated circuit packaging system in a further embodiment of the present invention. The method 1300 includes: providing a substrate in a block 1302; mounting a stiffener, having a stiffener opening completely through the stiffener, on the substrate in a block 1304; molding an encapsulation on the substrate and directly on an outer upper periphery surface of the stiffener and exposing an inner upper periphery surface of the stiffener, the encapsulation exposing a portion of the substrate in a block 1306; mounting an integrated circuit over the substrate and within the perimeter of the stiffener in a block 1308; and attaching a lid plate on the inner upper periphery surface of the stiffener and over the integrated circuit, the lid plate extending above an encapsulation top side in a block 1310.

Thus, it has been discovered that the integrated circuit packaging system of the present invention furnishes important and heretofore unknown and unavailable solutions, capabilities, and functional aspects for an integrated circuit packaging system with interconnects. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance. These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto set forth herein or shown in the accompanying drawings are to be interpreted in an illustrative and non-limiting sense.

What is claimed is:

1. A method of manufacture of an integrated circuit packaging system comprising:
   providing a substrate;
   mounting a stiffener, having a stiffener opening completely through the stiffener, on the substrate;
   molding an encapsulation on the substrate and directly on an outer upper periphery surface of the stiffener and exposing an inner upper periphery surface of the stiffener, the encapsulation exposing a portion of the substrate;
   mounting an integrated circuit over the substrate and within the perimeter of the stiffener; and
   attaching a lid plate on the inner upper periphery surface of the stiffener and over the integrated circuit, the lid plate extending above an encapsulation top side.

2. The method as claimed in claim 1 wherein mounting the stiffener includes forming an electrical connection between the stiffener and the substrate.

3. The method as claimed in claim 1 wherein forming the encapsulation includes forming an encapsulation inner sidewall over the stiffener, the encapsulation having a continuous, non-vertical surface around the stiffener opening.

4. The method as claimed in claim 1 wherein:
   mounting the stiffener includes providing a mold dam; and
   molding the encapsulation includes prohibiting the encapsulation to be formed beyond the stiffener functioning as the mold dam.

5. The method as claimed in claim 1 wherein attaching the lid plate includes mounting the lid plate on the inner upper periphery surface of the stiffener with a lid adhesive, the lid adhesive electrically conductive for forming an electromagnetic shield.

6. A method of manufacture of an integrated circuit packaging system comprising:
   providing a substrate;
   mounting a stiffener having a stiffener opening completely through the stiffener on the substrate;
   mounting a vertical interconnector on the substrate;
   molding an encapsulation directly on the substrate, a portion of the vertical interconnector, and an outer upper periphery surface, the encapsulation exposing an inner upper periphery surface of the stiffener, the encapsulation exposing a portion of the substrate;
   mounting an integrated circuit over the substrate and within the perimeter of the stiffener; and
   attaching a lid plate on the inner upper periphery surface of the stiffener and over the integrated circuit, the lid plate extending above an encapsulation top side.

7. The method as claimed in claim 6 wherein forming the encapsulation includes:
   positioning the top mold chase over the stiffener and directly on the inner upper periphery surface of the stiffener; and
   molding the encapsulation for forming an encapsulation inner sidewall directly on the top mold chase.

8. The method as claimed in claim 6 wherein attaching the lid plate includes attaching the lid plate having optical transparency over the integrated circuit with a vertical gap between the lid plate and the integrated circuit.

9. The method as claimed in claim 6 wherein attaching the lid plate includes attaching the lid plate to the integrated circuit with a lid adhesive and the lid adhesive is thermally conductive for dissipating heat.

10. The method as claimed in claim 6 wherein mounting the integrated circuit includes mounting the integrated circuit within the perimeter of an encapsulation opening, the integrated circuit can include a flip chip die, a complementary metal oxide semiconductor imaging sensor chip, a wire-bond die, or a combination thereof.

11. An integrated circuit packaging system comprising:
    a substrate;
    a stiffener having a stiffener opening completely through the stiffener on the substrate;
    an encapsulation directly on the substrate and an outer upper periphery surface of the stiffener, exposing an inner upper periphery surface of the stiffener;
    an encapsulation inner sidewall over the outer upper periphery surface of the stiffener;
    an integrated circuit over the substrate and within the perimeter of the stiffener; and
    a lid plate on an inner upper periphery surface and over the integrated circuit, the lid plate extending above an encapsulant top side.

12. The system as claimed in claim 11 wherein the stiffener includes an electrical connection between the stiffener and the substrate.

13. The system as claimed in claim 11 wherein the encapsulation includes the encapsulation inner sidewall over the stiffener and the encapsulation having a continuous non-vertical surface around the stiffener opening.

14. The system as claimed in claim 11 wherein the encapsulation is directly on a mold dam.

15. The system as claimed in claim 11 wherein the lid plate is over the inner upper periphery surface and directly on the lid adhesive.

16. The system as claimed in claim 11 further comprising a vertical interconnector mounted on the substrate outside of the perimeter of the stiffener.

17. The system as claimed in claim 16 wherein the encapsulation includes the encapsulation inner sidewall facing a portion of the lid plate.

18. The system as claimed in claim 16 wherein the lid plate is optically transparent and separated from the integrated circuit by a vertical gap.

19. The system as claimed in claim 16 wherein the lid plate is directly on the lid adhesive, the lid adhesive is thermally conductive for dissipating heat from the integrated circuit.

20. The system as claimed in claim 16 wherein the integrated circuit is within the perimeter of the encapsulation opening and the integrated circuit can include a flip chip die, a complementary metal oxide semiconductor imaging sensor chip, a wire-bond die, or a combination thereof.

* * * * *